US007043133B2

(12) United States Patent
Johnson et al.

(10) Patent No.: US 7,043,133 B2
(45) Date of Patent: May 9, 2006

(54) SILICON-OXYCARBIDE HIGH INDEX CONTRAST, LOW-LOSS OPTICAL WAVEGUIDES AND INTEGRATED THERMO-OPTIC DEVICES

(75) Inventors: Frederick G. Johnson, Lanham, MD (US); Oliver S. King, Annapolis, MD (US); David M. Gill, Pasadena, MD (US); Timothy J. Davidson, Baltimore, MD (US); Warren P. Berk, Joppatowne, MD (US)

(73) Assignee: Little Optics, Inc., Annapolis Junction, MD (US)

( * ) Notice: Subject to any disclaimer, the term of this patent is extended or adjusted under 35 U.S.C. 154(b) by 65 days.

(21) Appl. No.: 10/864,511

(22) Filed: Jun. 10, 2004

(65) Prior Publication Data

US 2004/0240820 A1 Dec. 2, 2004

Related U.S. Application Data

(63) Continuation-in-part of application No. 10/465,881, filed on Jun. 20, 2003, now Pat. No. 6,771,868, which is a continuation of application No. 09/944,207, filed on Sep. 4, 2001, now Pat. No. 6,614,977.

(60) Provisional application No. 60/304,811, filed on Jul. 12, 2001.

(51) Int. Cl.
*G02B 6/00* (2006.01)
*G02B 6/10* (2006.01)
*C03B 37/23* (2006.01)
*C03B 37/22* (2006.01)

(52) U.S. Cl. ............... 385/142; 385/129; 385/130; 385/131; 385/141; 65/385; 65/386

(58) Field of Classification Search ............... 385/139, 385/130, 131, 132, 129, 141, 142; 65/385, 65/386
See application file for complete search history.

(56) References Cited

U.S. PATENT DOCUMENTS 4,138,194 A    2/1979    Beasley et al. ............ 385/143

(Continued)

FOREIGN PATENT DOCUMENTS

WO    WO 01/64594    9/2001
WO    WO 02/35265    5/2002

OTHER PUBLICATIONS

G. Grand, J.P. Jadot, H. Denis, S. Valette, A. Fournier, and A.M. Grouillet, "Low-Loss PECVD Silica Chanel Waveguides For Optical Communications", Electronic Letters, vol. 26, No. 25, pp. 2135-2137, Dec. 6, 1990.

(Continued)

*Primary Examiner*—Brian Healy
*Assistant Examiner*—Charlie Peng
(74) *Attorney, Agent, or Firm*—DLA Piper Rudnick Gray Cary US LLP

(57) ABSTRACT

Silicon-oxycarbide optical waveguides and thermooptic devices include a substrate and a first cladding layer having a first refractive index positioned over a substrate. A first core layer comprising silicon, oxygen, and carbon and having a core refractive index is formed on the first cladding layer by chemical vapor deposition using at least two precursors: one inorganic silicon precursor gas and at least one second precursor gas comprising carbon and oxygen. Alternatively, at least three precursors can be used: one inorganic silicon precursor gas, a second precursor comprising carbon, and a third precursor comprising oxygen. The core layer is lithographically patterned to define waveguide elements. A second cladding layer having a second cladding refractive index is formed to surround the optical core waveguiding element of the first core layer.

52 Claims, 2 Drawing Sheets

U.S. PATENT DOCUMENTS

| | | | |
|---|---|---|---|
| 4,384,038 A | 5/1983 | Khoe et al. | 430/321 |
| RE31,868 E | 4/1985 | Beasley et al. | 385/143 |
| 4,583,997 A | 4/1986 | Staudigl | 95/92 |
| 4,689,065 A | 8/1987 | Krause | 65/407 |
| 4,863,236 A | 9/1989 | Herbrechtsmeier et al. | 385/143 |
| 4,871,221 A * | 10/1989 | Imoto | 385/130 |
| 5,053,244 A | 10/1991 | Kieser et al. | 427/571 |
| 5,059,475 A | 10/1991 | Sun et al. | 428/195.1 |
| 5,062,680 A | 11/1991 | Imamura et al. | 385/131 |
| 5,122,431 A * | 6/1992 | Kodama et al. | 430/128 |
| 5,175,790 A | 12/1992 | Groh et al. | 385/143 |
| 5,196,041 A | 3/1993 | Tumminelli et al. | 65/386 |
| 5,295,220 A | 3/1994 | Heming et al. | 385/142 |
| 5,323,482 A | 6/1994 | Stewart et al. | 385/141 |
| 5,332,827 A | 7/1994 | Stewart et al. | 546/347 |
| 5,385,594 A | 1/1995 | Kanamori et al. | 65/60.2 |
| 5,503,650 A | 4/1996 | Ishikawa et al. | 65/384 |
| 5,547,706 A | 8/1996 | Ackerman | 427/166 |
| 5,588,083 A | 12/1996 | Boonstra et al. | 385/122 |
| 5,593,741 A | 1/1997 | Ikeda | 421/579 |
| 5,672,672 A | 9/1997 | Amano et al. | 528/16 |
| 5,688,896 A | 11/1997 | Boonstra et al. | 528/196 |
| 5,844,363 A | 12/1998 | Gu et al. | 313/506 |
| 5,872,387 A | 2/1999 | Lyding et al. | 257/607 |
| 5,949,945 A | 9/1999 | Okano et al. | 385/132 |
| 5,972,765 A | 10/1999 | Clark et al. | 438/308 |
| 5,979,188 A | 11/1999 | Ojha | 65/386 |
| 6,023,093 A | 2/2000 | Gregor et al. | 207/632 |
| 6,025,280 A | 2/2000 | Brady et al. | 438/762 |
| 6,077,791 A | 6/2000 | DeTar | 438/778 |
| 6,122,934 A | 9/2000 | Narita et al. | 65/379 |
| 6,144,795 A | 11/2000 | Dawes et al. | 385/141 |
| 6,154,583 A | 11/2000 | Bazylenko et al. | 385/14 |
| 6,160,945 A | 12/2000 | Rhee et al. | 385/129 |
| 6,192,712 B1 | 2/2001 | Saito et al. | 65/386 |
| 6,211,065 B1 | 4/2001 | Xi et al. | 438/627 |
| 6,233,381 B1 | 5/2001 | Borrelli et al. | 385/37 |
| 6,434,318 B1 * | 8/2002 | Bischel et al. | 385/140 |
| 6,593,655 B1 | 7/2003 | Loboda et al. | 257/760 |
| 6,614,977 B1 | 9/2003 | Johnson et al. | 385/129 |
| 6,627,532 B1 | 9/2003 | Gaillard et al. | 438/263 |
| 6,768,828 B1 | 7/2004 | Gill et al. | 385/14 |
| 6,771,868 B1 | 8/2004 | Johnson et al. | 385/129 |
| 6,832,026 B1 * | 12/2004 | Carter et al. | 385/37 |
| 6,888,990 B1 * | 5/2005 | Block et al. | 385/50 |
| 6,920,159 B1 * | 7/2005 | Sidorin et al. | 372/20 |
| 2002/0154878 A1 | 10/2002 | Akwani et al. | 385/129 |
| 2004/0008968 A1 * | 1/2004 | Lee et al. | 385/142 |
| 2004/0086643 A1 * | 5/2004 | Onozawa et al. | 427/255.28 |
| 2005/0031284 A1 * | 2/2005 | Blalock et al. | 385/129 |

OTHER PUBLICATIONS

J. Yeh, and S. Lee, "Structural and Optical Properties of Amorphous Silicon Oxynitride", J. Appl. Phys. vol. 79, No. 2, pp. 656-663, Jan. 15, 1996.

A. Shih, J. Yeh, S. Lee, and T.R. Yang, "Structural and Electronic Differences Between Deuterated and Hydrogenated Amorphous Silicon", J. Appl. Phys. vol. 88, No. 3, pp. 1684-1687, Aug. 1, 2000.

J. Yota, J. Hander, and A.A. Saleh, "A Comparative Study on Inductively-Coupled Plasma High-Density Plasma, Plasma-Enhanced, and Low Pressure Chemical Vapor Deposition Silicon Nitride Films", J. Vac. Sci. Technol. A., vol. 18, No. 2, pp. 372-376, Mar./Apr. 2000.

L. Martinu, and D. Poitras, "Plasma Deposition of Optical Films and Coatings: A Review", J. Vac. Sci. Technol. A vol. 18, No. 6, pp. 2619-2645, Nov./Dec. 2000.

R. Germann, H.W.M. Salemink, R. Beyeler, F. Horst, I. Massarek, and B.J. Offrein, "Silicon Oxynitride Layers for Optical Waveguide Applications", J. Electrochemical Society, vol. 147, No. 6, pp. 2237-2241, 2000.

T. Watanabe, N. Ooba, S. Hayashida, T. Kurihara, and S. Imamura, "Polymeric Optical Waveguide Circuits Formed Using Silicone Resin", J. Lightwave Technology, vol. 16, No. 6, pp. 1049-1055, Jun. 1998.

Bona, et al., "SiON high-refractive-index waveguide and planar lightwave circuits", IBM Journal Research & Development, vol. 47, No. 2/3, 2003.

Kim et al. "Characterization of low-dielectric-constant SiOC thin films deposited by PECVD for interlayer dielectrics of multilevel interconnection" Surface and Coatings Technology, vol. 171, pp. 39-45 (2003).

* cited by examiner

SILICON-OXYCARBIDE HIGH INDEX CONTRAST, LOW-LOSS OPTICAL WAVEGUIDES AND INTEGRATED THERMO-OPTIC DEVICES

This is a continuation-in-part of U.S. patent application Ser. No. 10/465,881 filed Jun. 20, 2003, now U.S. Pat. No. 6,771,868, which is a continuation of U.S. patent application Ser. No. 09/944,207 filed Sep. 4, 2001, now U.S. Pat. No. 6,614,977 which claims priority from U.S. Provisional Application Ser. No. 60/304,811 filed Jul. 12, 2001. The entirety of these applications is incorporated herein by reference.

BACKGROUND OF THE INVENTION

1. Field of the Invention

This invention pertains to integrated optical circuits with optical waveguides having high index contrast and low optical loss for passive optical devices, thermooptic devices, and integrated optical circuits. More particularly, the invention pertains to the chemical vapor deposition of silicon-oxycarbide optical films and the formation of optical core elements and cladding layers to form optical waveguides and integrated thermooptic devices.

2. Description of the Related Art

Long haul, metropolitan, and local networks predominantly rely on optical communications for the transmission of data between nodes. More recently, optical data transmission has been used for computing and data processing systems to enable high bandwidth communications between processors, memory, and I/O. Many of the functions required by optical communications networks are currently handled by collections of discrete devices. Significant cost, size, and performance improvements may be obtained by shrinking optical waveguide circuitry and integrating multiple devices and optical functions on a single chip to form integrated optical circuits.

Optical waveguides are the key building block of integrated optical circuits. FIG. 1 depicts one typical planar optical waveguide 10 formed on a substrate or wafer 20. The lower optical cladding 30 is formed first. Next, optical core 40 is formed by chemical vapor deposition, lithographic patterning, and etching. Finally, the core 40 is surrounded with an upper optical cladding layer 50. An optical waveguide or combination of optical waveguides can be assembled to form devices such as ring resonators, arrayed waveguide gratings, couplers, splitters, polarization splitters/combiners, multimode interference (MMI) couplers, Mach-Zehnder interferometers, mode transformers, optical vias, and polarization rotators. These devices may then be combined on an optical chip to create an integrated optical device or circuit that performs one or more optical functions such as multiplexing/demultiplexing, optical add/drop, variable attenuation, switching, splitting/combining, tunable filtering, variable optical delay, clock distribution, and dispersion compensation.

The material system most commonly used for planar optical waveguide devices is germanium doped silicon oxide $SiO_2$:Ge. The waveguide consists of a $SiO_2$:Ge optical core element, having a first refractive index, that is surrounded by lower and upper cladding layers each, having smaller refractive indices. Typical cladding layer materials include silica ($SiO_2$) and doped silicas such as phosphosilicate glass (PSG), borosilicate glass (BSG), borophosphosilicate glass (BPSG), and flourine doped silica (SiOF). The ability to shrink the dimensions of an optical circuit is generally limited by the refractive index contrast of the optical waveguides from which it is formed, where the refractive index contrast is defined as the ratio $(n_{core}-n_{clad})/n_{clad}$ where $n_{core}$ is the refractive index of the core and $n_{clad}$ is the refractive index of the cladding. The smallest possible size of an optical device is constrained by the minimum allowable radius of curvature of its optical waveguides before incurring significant optical propagation loss of 0.5 dB/cm or more. The minimum allowable radius of curvature is inversely proportional to the refractive index contrast. Thus, the higher the index contrast, the smaller the curvature of the waveguide, and hence the smaller the device, can be. For $SiO_2$:Ge based optical waveguides, the maximum index contrast is limited to about 0.03 (3%), resulting in a minimum radius of curvature of at least 500 μm. As an example, a single ring resonator waveguide structure formed in this material system would at best consume approximately 1 $mm^2$ area.

Silicon-oxynitride (SiON) is another doped silica that has been used for the fabrication of planar lightwave circuits (see, e.g., G. L. Bona, R. Germann, and B. J. Offrein, "SiON high refractive index waveguide and planar lightwave circuits," IBM J. Res. & Dev. 47 (2/3), 239 (2003) incorporated herein by reference). Low loss optical waveguides have been demonstrated having SiON core elements and $SiO_2$ cladding layers with significantly higher refractive index contrasts than is possible with $SiO_2$:Ge (see, e.g., U.S. Pat. No. 6,614,977 and International Publication No. WO0164594, both incorporated herein by reference). Optical waveguides with refractive index contrasts of about 0.17 (17%) can be fabricated from SiON core elements, having a refractive index of 1.7, and $SiO_2$ cladding layers, having a refractive index of 1.45 measured at a wavelength of 1550 nm. At this high index contrast, waveguides can be designed with radii of curvature as small as about 40 μm. For the SiON core elements, the highest potential refractive index value is 2, corresponding to silicon-nitride ($Si_3N_4$).

A common optical element in most optical integrated circuits is a thermooptic device, wherein a portion of the optical core waveguiding elements within the device is locally heated with respect to the rest of the device by use of a local resistive heating element. Local heating of a waveguide shifts the phase of an optical signal within the waveguide by way of the thermooptic effect on refractive index (dn/dT). In addition, there can be a secondary contribution to the thermally induced phase shift resulting from thermal expansion of waveguide dimensions.

A primary factor contributing to the overall performance of an integrated optical circuit containing thermooptic devices is power consumption. Power consumption affects the cost of optical systems through footprint, thermal dissipation, airflow, peltier cooler, and power supply requirements. The power consumption of a thermooptic device depends on several factors including device size as well as dn/dT. By increasing the refractive index contrast, the overall device size can be reduced to minimize the active area that must be heated. Even more significantly, increasing the material dn/dT lowers the temperature rise needed to change the refractive index by a given amount. For example, an optical device such as a ring resonator has a set of resonant wavelengths given approximately by:

$$\lambda_i = 2\pi r\, n/i$$

where r is the ring radius, n is the optical waveguide effective index, and i is an integer. The resonant wavelengths of the ring may be changed by locally raising or lowering the temperature of the ring waveguide, and the effective refractive index may be approximated by $$n = n_o + (dn/dT)\Delta T$$

where $n_o$ is the effective index at temperature $T_o$, $dn/dT$ is the rate of change of refractive index with temperature at $T_o$, and $\Delta T$ is the net change in temperature $T-T_o$. For optical devices formed from $SiO_2$:Ge, the $dn/dT$ is typically just under $1\times10^{-5}/°$ C., and for optical devices formed from chemical vapor deposited SiON-based optical waveguides with core element refractive indices of 1.7, the $dn/dT$ is typically about $1.2\times10^{-5}/°$ C. By maximizing the $dn/dT$, a smaller temperature difference is needed to effect a specific change in refractive index. As a result, the optical power requirement of a device is minimized.

Silicon-oxycarbide (SiOC) is another doped silica that has recently been investigated extensively for electronic applications as an interlayer dielectric (ILD). SiOC films deposited using chemical vapor deposition (CVD) with an organosilicon precursor can be used to form a lower dielectric constant ILD than standard $SiO_2$ (see, e.g., U.S. Pat. No. 6,627,532; U.S. Pat. No. 6,593,655; and H. J. Kim, Q. Shao, and Y. H. Kim, "Characterization of low-dielectric-constant SiOC thin films deposited by PECVD for interlayer dielectrics of multilevel interconnection," Surface and Coatings Technology 171, 39 (2003) incorporated herein by reference). The mechanism by which the dielectric constant is reduced below that of $SiO_2$ is through the replacement of oxygen atoms with terminating hydrocarbon groups from the organosilicon precursor and the subsequent decrease in film density. The CVD process and SiOC materials developed for electronic applications, however, do not pertain to high index contrast optical waveguides as the refractive index of these materials decreases along with the dielectric constant. The resulting SiOC films have a refractive index less than that of $SiO_2$ and are not suitable for use as high refractive index optical core elements.

SUMMARY OF INVENTION

The present invention addresses the aforementioned issues to a great extent by providing an optical core element having a refractive index of between about 1.5 and 2.5 and having a $dn/dT$ of between about $1\times10^{-5}/°$ C. and about $3\times10^{-5}/°$ C. By using a standard CVD (chemical vapor deposition) process such as PECVD (plasma-enhanced CVD), a stable and uniform SiOC film may be deposited having a film stress that is tunable from tensile to highly compressive and that can be optimized to have a low stress value of less than 100 MPa. When combined with an optical cladding such as $SiO_2$, the SiOC optical core element can be used to form optical waveguides with refractive index contrasts as high as about 0.72 (72%).

In some embodiments, the silicon-oxycarbide optical waveguides and thermooptic devices include a substrate or wafer that may contain preformed optical and electronic devices. A first cladding layer having a first refractive index is positioned on the substrate or wafer. A first core layer comprising silicon, oxygen, and carbon and having a core refractive index is formed on the first cladding layer by chemical vapor deposition using at least two precursors: one inorganic silicon precursor gas and at least one second precursor gas comprising carbon and oxygen. Alternatively, precursors can be selected such that there are at least three precursor gases or vapors: one inorganic silicon precursor gas, a second precursor comprising carbon, and a third precursor comprising oxygen. The core layer is lithographically patterned to define waveguiding elements. A second cladding layer having a second cladding refractive index is formed to surround the optical core waveguiding element of the first core layer. The first and second cladding layer refractive indices are chosen to be less than the refractive index of the first core layer. The second cladding layer may be air, polymer, or glass. Glass claddings may be formed through cladding layer deposition, deposition and reflow, or simultaneous deposition and removal techniques (e.g., see U.S. patent application Ser. No. 10/441,052 incorporated herein by reference). The overall process can be repeated to overlay multiple optical waveguides and form an integrated optical circuit having multiple layers. Waveguides in different layers may be interconnected through the use of optical vias that transport optical signals from one layer to another layer positioned above or below. Local heaters can be positioned near portions of optical waveguides to form thermooptic devices. The integrated optical circuit may be linked to other devices, circuits, or communications networks through free space or fiber optic interconnects.

BRIEF DESCRIPTION OF THE DRAWINGS

A more complete appreciation of the invention and many of the attendant features and advantages thereof will be readily obtained as the same become better understood by reference to the following detailed description when considered in connection with the accompanying drawings, wherein.

DETAILED DESCRIPTION

In the following detailed description, a plurality of specific details, such as precursors and refractive index contrasts are set forth in order to provide a thorough understanding of the present invention. The details discussed in connection with the preferred embodiments should not be understood to limit the present invention. Furthermore, for ease of understanding, certain method steps are delineated as separate steps; however, these steps should not be construed as necessarily distinct nor order dependent in their performance.

Optical waveguides are the fundamental building block of integrated optical devices and circuits. The expression "integrated optical circuits" includes a combination of optically transparent elongated structures for guiding, manipulating, or transforming optical signals that are formed on a common substrate or chip of monolithic or hybrid construction. The substrate can include electrical, optical, and optoelectronic devices and circuits. The transparent elongated optical structures can create a single optical device (e.g., an individual microresonator) or an optical system (e.g., a series of microresonators formed into a demultiplexer or tunable filter). Additionally, micro-heaters may be positioned in portions of the circuit to locally change or tune the local refractive index to create a thermooptic device. The techniques of the present invention are not limited to the formation of particular optical circuits or devices but are broadly applicable to any optical configuration that includes an optical waveguide formed on a substrate or wafer.

Figure 1:
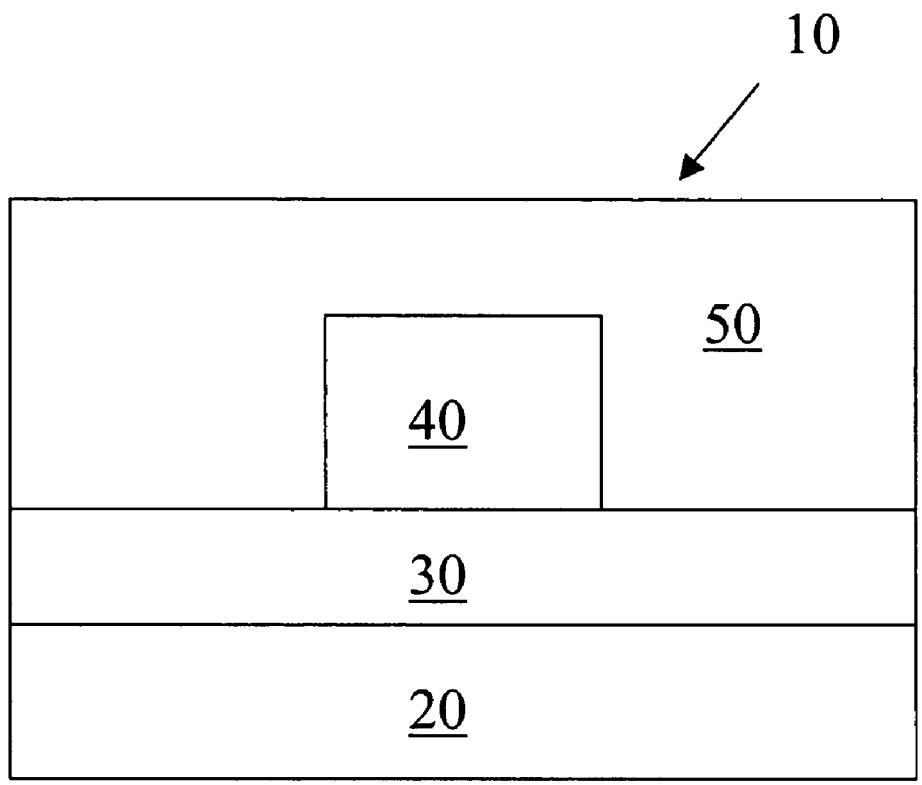
FIG. 1 depicts a ridge waveguide.

FIG. 1 depicts an examplary planar optical waveguide known as a ridge waveguide. The ridge waveguide 10 is formed on a substrate or wafer 20 by forming a lower optical cladding 30; then forming, through chemical vapor deposition, lithographic patterning, and etching, an optical core element 40; and lastly by surrounding the optical core element with an upper optical cladding layer 50. Other types of optical waveguides commonly employed in the formation of integrated optical devices and circuits and within the scope of the present invention include slab, ridge loaded, trench defined, and filled trench waveguides.

The substrate 20 may be selected from any suitable material or wafer such as silicon, silica, fused quartz, sapphire, glass, gallium-arsenide, silicon-carbide, indium-phosphide, silicon-on-insulator, germanium-on-insulator, silicon-germanium or other carriers. The selected substrate or wafer may consist of a single material (e.g. a silicon wafer), a stack of several different materials (e.g. germanium on insulator), or a preformed device(s) or circuit(s). A preformed device or circuit may contain one or more electrical devices (e.g., transistors), optical devices (e.g., mode transformers), microelectromechanical systems (MEMS) devices (e.g., mirrors), and optoelectronic devices (e.g., detectors, amplifiers, modulators, light emitting diodes, and lasers).

The lower optical cladding 30 of the optical waveguide 10 of FIG. 1 is formed or deposited on substrate 20 and is chosen to have an optical refractive index that is lower than the refractive index of the core element 40. Lower optical claddings may be formed by a thermal oxidation process, such as the oxidation of a silicon wafer to form an $SiO_2$ thermal oxide layer on the surface. Alternatively, a vapor deposition process such as plasma enhanced chemical vapor deposition (PECVD), high density plasma chemical vapor deposition (HDPCVD), low pressure chemical vapor deposition (LPCVD), flame hydrolysis, or atmospheric pressure chemical vapor deposition (APCVD) can be used to deposit the lower optical cladding layer. Example materials that may be deposited to form a lower cladding are: silica ($SiO_2$), germanium doped silica ($SiO_2$:Ge), silicon-oxyflouride (SiOF), silicon-oxycarbide (SiOC), silicon-oxynitride (SiON), borosilicate glass (BSG), phosphosilicate glass (PSG) and borophosphosilicate glass (BPSG). Typical lower cladding film thicknesses may vary from 0.5 to 20 um depending on the particular refractive index contrast employed. Lower cladding layer thicknesses of up to about 50 um may be desirable for thermooptic devices as such thicknesses provide additional thermal insulation between the waveguide and the substrate.

To form the optical core element 40 of the optical waveguide 10 in FIG. 1, the silicon oxycarbide (SiOC) optical core layer must first be deposited over the lower optical cladding 30. Plasma enhanced chemical vapor deposition (PECVD), high density plasma chemical vapor deposition (HDPCVD), low pressure chemical vapor deposition (LPCVD), flame hydrolysis, or atmospheric pressure chemical vapor deposition (APCVD) are some of the CVD techniques that may be used to deposit the optical core layer.

Conventional chemical vapor deposition techniques for depositing SiOC films for electronic applications (see, e.g., U.S. Pat. No. 6,627,532; U.S. Pat. No. 6,593,655; and H. J. Kim, Q. Shao, and Y. H. Kim, "Characterization of low-dielectric-constant SiOC thin films deposited by PECVD for interlayer dielectrics of multilevel interconnection," Surface and Coatings Technology 171, 39 (2003), all of which are incorporated herein by reference) were developed with a goal of forming porous, lower density films with low dielectric constant and low refractive index (n<1.45). These processes use two primary precursors: one organosilicon gas (such as tetraethoxysilane (TEOS) or methyl containing silanes such as trimethylsilane) comprising silicon, hydrogen and carbon along with a second precursor gas bearing oxygen.

The present invention forms a higher density, less porous SiOC film with a higher refractive index (1.5<n<2.5) for use as the core element layer 40 of an optical waveguide 10 in FIG. 1. This is achieved by substituting the organosilicon gas with an inorganic silicon gas precursor comprising silicon and not carbon and adding at least one more gas comprising carbon. The optical core element is then formed using chemical vapor deposition with at least two precursors: one inorganic silicon precursor gas and at least one second precursor gas comprising carbon and oxygen. Alternatively, precursors can be selected such that there are at least three primary precursor gases or vapors: one inorganic silicon precursor gas, a second precursor comprising carbon, and a third precursor comprising oxygen. Examples of inorganic gaseous precursors comprising silicon include: $SiH_4$, $SiD_4$, $SiCl_4$, $SiD_2Cl_2$, $SiH_2Cl_2$, $SiDCl_3$, $SiHCl_3$, and $SiF_4$. Examples of precursors comprising carbon and oxygen include: CO and $CO_2$. Examples of precursors comprising carbon include: $CH_4$, $CD_4$, $C_4H_8$, $C_4D_8$, $C_4H_{10}$, $C_4D_{10}$, $C_4H_6$, $C_4D_6$, $C_2H_2$, $C_2D_2$, $C_2H_6O$, $C_2D_6O$, $C_2H_7N$, $C_2D_7N$, $C_2H_6$, $C_2D_6$, $C_2H_4$, $C_2D_4$, $C_3H_8$, $C_3D_8$, $C_3H_6$, $C_3D_6$ and $CF_4$. Lastly, examples of precursors comprising oxygen include: $O_2$, $O_3$, $H_2O$, $H_2O$, NO, and $N_2O$. Additional gaseous precursors comprising nitrogen, flourine, germanium, boron, or phosphorus may be added to form more complex doped silicon-oxycarbide films such as SiOCF, SiOCN, SiOCGe, SiOCP, or SiOCB. Those of skill in the art will recognize that it is possible to use combinations of the precursors listed above even though more than one of the precursors may contain silicon, carbon and/or oxygen (e.g., it is possible to use both CO and $CO_2$, or both CO and $C_2D_6O$, etc.).

The film deposition process parameters are chosen to be compatible with the selected core element deposition process and tool. For PECVD and HDPCVD, for example, some pertinent parameters (e.g., deposition time, gap spacing, plasma power, chamber pressure, substrate temperature, dilution gases, and gas flow rates) are adjusted to optimize the film's thickness, thickness uniformity, refractive index, refractive index uniformity, stress, and temperature stability. The relative amounts of carbon and oxygen in the SiOC film can be controlled by adjusting the amount of carbon and oxygen in the precursor gases. Oxygen rich SiOC films have a lower refractive index, whereas carbon rich SiOC films have a higher refractive index. By selecting appropriate precursor gases and adjusting the flow rates, SiOC films with refractive indices from about 1.5 to 2.5 may be formed.

Film stress is influenced by nearly all the process parameters but is generally tuned by varying the power, gap, pressure, and the flow rates of dilution or carrier gases, such as argon or nitrogen. Low stress films are more desirable for subsequent processing steps, such as lithography, as high stress films tend to bow wafers. By optimizing the deposition process parameters, SiOC film stresses of about 100 MPa or less are achievable.

Film thermal stability is generally related to film stress, density, and the hydrogen or deuterium content of the film. Low stress, higher density and lower hydrogen content films are generally more stable at higher temperatures. Of the various CVD techniques, HDPCVD produces higher density and lower hydrogen (deuterium) content films. Hydrogen or deuterium content may be minimized by choosing a high density CVD process, such as HDPCVD, or by increasing the deposition temperature, minimizing the hydrogen content of the precursor gases, or by post-deposition annealing at elevated temperatures.

Figure 2:
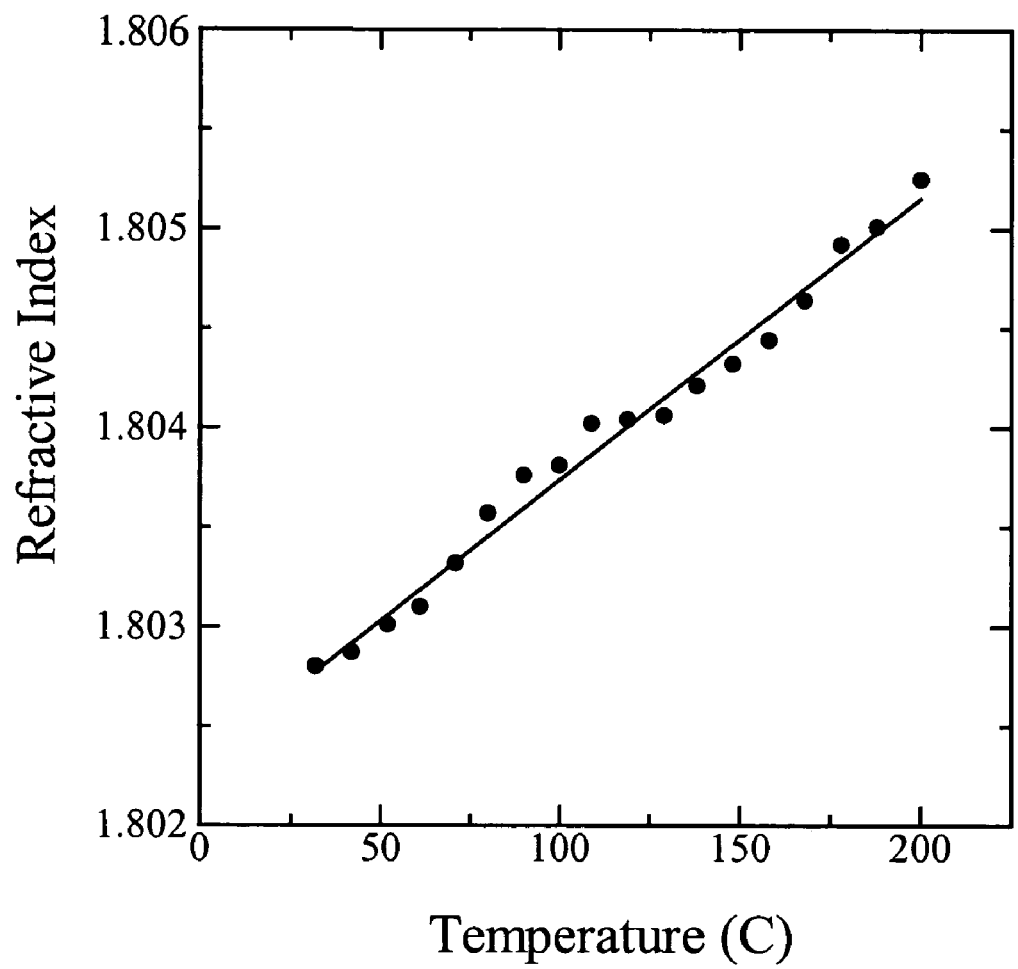
FIG. 2 is a plot of the refractive index versus temperature data for an n=1.8 refractive index SiOC film.

As an example, a SiOC film was grown on bare silicon using a Trion Technology (Tempe, Ariz.) Oracle PECVD system. The deposition process parameters comprise RF power 40 watts, pressure 700 mTorr, deposition temperature 350° C. with gas flows of 250 sccm of 2% $SiH_4$ in balance nitrogen, 50 sccm $CH_4$, and 15 sccm $N_2O$ for 3200 seconds. The resulting film was 1520 nm thick having a compressive film stress of −80 MPa and with a refractive index of 1.8 as measured at 1550 nm wavelength. The dn/dT for this material is shown in FIG. 2 and averages about $1.4 \times 10^{-5}$/° C. between 50° and 200° C. at a wavelength of 1550 nm.

These process deposition parameters depend on the choice of CVD tool and represent only one example process that may be used to form SiOC films. Alternatively, other PECVD tools and processes may be used with a wide range of process parameters. For example, the process parameters for PECVD deposition of doped silica films in an Applied Materials (Santa Clara, Calif.) P5000 system may range from about 200 to 900 watts RF power, 300° to 550° C. deposition temperatures, and 1 to 6 torr chamber pressures. Typical deposition rates vary from about 0.1 to 1 microns/minute with various precursor gas flows ranging from as low as 5 sccm to as high as 200 sccm per minute and carrier or dilution gas flows as high as about 4000 sccm. As a further example as to the range of process parameters, additional example CVD processes such as HDPCVD can produce high quality films at temperatures as low as 200° C. whereas LPCVD deposition processes may employ temperatures as high as about 900° C.

After SiOC film deposition, optical waveguiding core elements are then patterned into the optical core layer. This may be done with lithographic processes such as photolithography, x-ray lithography, or e-beam lithography that transfer a pattern from a mask into resist or alternatively, directly writing a pattern into resist residing on top of the optical core layer. The resist is then developed and used as an etch mask or used in a manner to next deposit a different etch mask material (e.g. metal or dielectric) over or around the optical core element. The mask pattern is then transferred into the optical core film layer through the selective removal of material not covered by the mask through etching. Examples of several etching techniques include: wet chemical etching, ion beam etching, sputtering, plasma etching (e.g. reactive ion etching or RIE), inductively coupled plasma etching (ICP), high density plasma etching (HDP), or electron cyclotron resonance etching (ECR), but other techniques for removal of selected portions of the optical core layer are also possible. As an example, the optical waveguide in FIG. 1 may be formed with an optical core element 40 having a width and height varying from about 0.5 to about 10 microns depending on the particular refractive index, refractive index contrast, and wavelength (s) of operation.

The upper cladding 50 of FIG. 1 may consist of air, polymer, or glass. Glass claddings may be formed through cladding layer deposition, deposition and reflow, or simultaneous deposition and removal techniques (e.g., see U.S. patent application Ser. No. 10/441,052, incorporated herein by reference). One of the more common techniques is the deposition and annealing of a glass such as BPSG where the cladding is built through multiple cycles of CVD and high temperature annealing that causes the glass to flow. More recently, HDPCVD techniques for forming dense, planarized upper cladding layers (e.g., see U.S. patent application Ser. No. 10/441,052, incorporated herein by reference) have been developed. Example glass materials that may be deposited to form an upper cladding are: silica ($SiO_2$), germanium doped silica ($SiO_2$:Ge), silicon-oxyflouride (SiOF), silicon-oxycarbide (SiOC), silicon-oxynitride (SiON), borosilicate glass (BSG), phosphosilicate glass (PSG) and borophosphosilicate glass (BPSG) and other more complex doped silicas containing more than three constituent elements.

By selecting a core element and cladding refractive indices, the optical waveguide refractive index contrast is determined. As mentioned above, by choosing a higher refractive index contrast and the appropriate waveguide geometry, very small bend radii are possible for optical waveguides within integrated optical circuits without incurring significant propagation losses greater than 0.5 dB/cm or, more preferably, greater than 0.2 dB/cm. By choosing $SiO_2$ cladding layers with a refractive index of 1.45 and SiOC core elements with refractive indices of about 1.6, 1.7, 1.8, 2, or 2.5 for example, refractive index contrasts of about 0.1, 0.17, 0.24, 0.38, and 0.72 are achievable. This range of index contrasts correspond to minimum waveguide bend radii from about 100 um. at an index contrast of 0.1 to about 10 um for very high contrasts.

Other important loss mechanisms are optical absorption and optical scattering losses. Scattering loss is common to all optical waveguide designs and is generally caused by roughness at the interfaces between core and clad as well as any inhomogeneities in the film. Absorptive loss is primarily dominated by optical absorption that excites stretching vibrational modes of atomic bonds between hydrogen or deuterium and heavier elements present in the film. SiOC films formed by chemical vapor deposition may contain from about 0.1% to 30% atomic hydrogen (H) or deuterium (D) depending on the particular deposition technique and process parameters. The optical loss from absorption depends highly on the amount of H or D in the film and on the particular optical wavelength or wavelengths propagating in the waveguide. The potential absorption features in SiOC:H and SiOC:D relate to the stretching vibrational modes and their associated overtones for Si—H, O—H, and C—H or Si-D, O-D, and C-D bonds, respectively. For the particular range of optical wavelengths commonly used for fiber optic communications, from 1450 nm to 1650 nm, SiOC:H optical waveguides have an added advantage over SiON:H in that the only vibrational absorption feature in this optical band corresponds to the second overtone of the Si—H mode centered near 1.51 micron wavelength, whereas SiON:H has an additional strong absorption feature from the 1st overtone of the N—H vibrational mode, also centered near 1.51 micron wavelength.

Optical absorptive loss is an issue only for optical wavelengths near the primary or lower order overtones of a hydrogen or deuterium related vibrational stretching mode. As a result, most of the visible and near IR spectrum has low optical absorptive loss. For optical wavelengths near absorption features, the absorption strength can be minimized by reducing the amount of hydrogen in the film by selecting lower hydrogen content precursors, optimizing the deposition process, or by post-deposition annealing. Additionally, the strength of a stretching vibrational mode absorption feature decreases significantly for higher overtones. By replacing hydrogen with deuterium, the energy of the set of related primary and overtone stretching vibrational modes decreases by about $$\frac{1}{\sqrt{2}}$$

because of the heavier atomic mass of deuterium as compared to hydrogen. This moves the entire set of absorption features to longer wavelengths. For the particular case of the optical band from about 1.45 to 1.65 micron wavelength, replacing H with D in an SiOC film clears the optical band such that no primary, first overtone, or second overtone features appear in the band from the Si-D, C-D, and O-D vibrational modes.

A thermooptic device or devices can be formed within an integrated optical circuit by positioning resistive heaters over or near portions of optical waveguides within a device. Many conventional processes are available for forming resistive heaters on glass. For the case of forming a conformal, strip, or serpentine heater on the upper cladding layer of an optical waveguide, one example comprises the steps of: lithographically patterning photoresist in order to open areas over the waveguide to be heated; electron beam or thermal evaporation of metal (e.g., gold, platinum, chrome, nickel, or nichrome) over the patterned surface; followed by a standard lift off process to remove the and the portion of metal residing on the resist. Alternatively, a vapor deposited or sputter deposited metal layer can simply be lithographically patterned and etched to form a heater pattern. Optionally, temperature sensors (e.g. resistive temperature devices (RTD's), thermistors, or thermocouples) may also be positioned over or near the heated waveguides to monitor the local temperature for use in a feedback loop that controls the electrical power supplied to the heater.

The heater power required to operate a thermooptic device depends both on the device size as well as the change in temperature ($\Delta T$) needed to achieve the desired change in refractive index ($\Delta n$). SiOC high refractive index contrast optical wavguides enable the formation of smaller optical devices. Furthermore, the ratio $\Delta n/\Delta T$ or, more appropriately, the dn/dT for SiOC can be made larger than what is available with more conventional optical materials such as $SiO_2$:Ge. The dn/dT of SiOC increases with increasing refractive index and carbon content. Low carbon content SiOC with a refractive index of about 1.5 will have a dn/dT of about $1\times10^{-5}/°$ C., whereas higher carbon content SiOC films can have dn/dT values up to $3\times10^{-5}/°$ C. Both smaller size and higher dn/dT enable the formation of more efficient thermooptic devices.

The process discussed above can be repeated to overlay multiple optical waveguides. In this manner, an integrated optical circuit having multiple layers may be formed. Waveguides and optical devices in different layers may be interconnected through the use of optical vias, mode transformers, or reflectors that transport optical signals from one layer to another layer positioned above or below. Optical vias, mode transformers, or reflectors may also be used to access underlying preformed electronic, optical, or optoelectronic devices beneath the optical waveguide layers of the integrated optical circuit.

Obviously, numerous modifications and variations of the present invention are possible in light of the above teachings. It is therefore to be understood that within the scope of the appended claims, the invention may be practiced otherwise than as specifically described herein.

What is claimed is:

1. A device comprising:
   a first cladding formed over a substrate;
   a core formed over the first cladding, the core comprising silicon, oxygen, and carbon, the core having a refractive index between 1.5 and 2.5, the core having a dn/dT between $1\times10^{-5}$ and $3\times10^{-5}$ per degree Celsius, the core being formed by a chemical vapor deposition (CVD) process using an inorganic precursor comprising silicon; and
   a second cladding formed over the core and the first cladding such that the core, the first cladding, and the second cladding form an optical waveguide.

2. The device of claim 1, wherein a second precursor comprising carbon and oxygen is used in the CVD process.

3. The device of claim 2, wherein the second precursor is selected from the group consisting of CO, $CO_2$, $C_2H_6O$, $C_2D_6O$, and combinations thereof.

4. The device of claim 1, wherein a second precursor comprising carbon and a third precursor comprising oxygen are used in the CVD process.

5. The device claim 1, wherein the core has a height of 0.5 to 10 microns and width of 0.5 to 10 microns.

6. The device of claim 1, wherein the substrate is selected from the group consisting of silicon, silica, fused quartz, sapphire, glass, gallium-arsenide, silicon-carbide, indium-phosphide, silicon-on-insulator, germanium-on-insulator, and silicon-germanium.

7. The device of claim 1, wherein the substrate contains one or more preformed devices selected from the group consisting of electrical devices, optical devices, microelectromechanical (MEMS) devices, optoelectronic devices, and combinations thereof.

8. The device of claim 1, wherein the inorganic precursor comprising silicon is selected from the group consisting of $SiH_4$, $SiD_4$, $SiCl_4$, $SiD_2Cl_2$, $SiH_2Cl_2$, $SiDCl_3$, $SiHCl_3$, $SiF_4$ and combinations thereof.

9. The device of claim 4, wherein the second precursor is selected from the group consisting of $CH_4$, $CD_4$, $C_4H_8$, $C_4D_8$, $C_4H_{10}$, $C_4D_{10}$, $C_4H_6$, $C_2H_2$, $C_2D_2$, $C_2H_7N$, $C_2D_7N$, $C_2H_6$, $C_2D_6$, $C_2H_4$, $C_2D_4$, $C_3H_8$, $C_3D_8$, $C_3H_6$, $C_3D_6$, $CF_4$ and combinations thereof.

10. The device of claim 4, wherein the third precursor is selected from the group consisting of $O_2$, $O_3$, $H_2O_2$, $H_2O$, NO, and $N_2O$.

11. The device of claim 1, wherein dilution or carrier gases comprising argon or nitrogen are also used in the CVD process.

12. The device of claim 1, further comprising at least one thermooptic device.

13. The device of claim 12, further comprising a local resistive heater for heating the thermooptic device.

14. The device of claim 13, wherein a temperature of the thermooptic device is monitored with a local temperature sensor selected from the group consisting of a resistive temperature device, a thermistor, and a thermocouple.

15. The device of claim 1, wherein the CVD process is selected from the group consisting of plasma enhanced CVD, high density plasma CVD, low pressure CVD, and atmospheric pressure CVD.

16. The device of claim 1, wherein the core further comprises hydrogen, deuterium, nitrogen, germanium, phosphorus, boron, or flourine.

17. The device of claim 1, further comprising multiple layers of optical waveguides.

18. The device of claim 1, wherein the refractive index contrast is between 0.1 and 0.72.

19. The device of claim 1, wherein the refractive index contrast is between about 0.18 and 0.72.

20. The device of claim 1 wherein the dn/dT of the core is between about $1.0\times10^{-5}$ and about $2\times10^{-5}$.

21. The device of claim 1, wherein the waveguide has a form selected from the group consisting of ridge, trench, and filled-trench optical waveguides.

22. The device of claim 1, further comprising a light source connected to supply an optical signal to the optical waveguide, wherein the optical loss is less than 0.5 dB/cm at an optical wavelength or band of wavelengths of the optical signal.

23. The device of claim 22, wherein the optical signal contains a wavelength within the range 1.45 to 1.65 microns.

24. The device of claim 1, wherein the first cladding is $SiO_2$ thermal oxide having a thickness of between 0.5 microns and 50 microns.

25. The device of claim 1, wherein the second cladding is deposited using high density plasma chemical vapor deposition.

26. A method for forming an optical waveguide comprising:
forming a first cladding over a substrate;
forming a core over the first cladding, the core comprising silicon, oxygen, and carbon, the core having a refractive index between 1.5 and 2.5, the core having a dn/dT between $1\times10^{-5}$ and $3\times10^{-5}$ per degree Celsius, the core being formed by a chemical vapor deposition (CVD) process using an inorganic precursor comprising silicon; and
forming a second cladding over the core such that the first cladding, the core and the second cladding form an optical waveguide.

27. The method of claim 26, wherein a second precursor comprising carbon and oxygen is used in the CVD process.

28. The method of claim 27, wherein the second precursor is selected from the group consisting of $CO$, $CO_2$, $C_2H_6O$, $C_2D_6O$, and combinations thereof.

29. The method of claim 26, wherein a second precursor comprising carbon and a third precursor comprising oxygen are used in the CVD process.

30. The method of claim 26, wherein the core has a height of 0.5 to 10 microns and width of 0.5 to 10 microns.

31. The method of claim 26, wherein the substrate is selected from the group consisting of silicon, silica, fused quartz, sapphire, glass, gallium-arsenide, silicon-carbide, indium-phosphide, silicon-on-insulator, germanium-on-insulator, and silicon-germanium.

32. The method of claim 26, wherein the substrate contains one or more preformed devices selected from the group consisting of electrical devices, optical devices, microelectromechanical (MEMS) devices, optoelectronic devices, and combinations thereof.

33. The method of claim 26, wherein the inorganic precursor comprising silicon is selected from the group consisting of $SiH_4$, $SiD_4$, $SiCl_4$, $SiD_2Cl_2$, $SiH_2Cl_2$, $SiDCl_3$, $SiHCl_3$, $SiF_4$ and combinations thereof.

34. The method of claim 29, wherein the second precursor is selected from the group consisting of $CH_4$, $CD_4$, $C_4H_8$, $C_4D_8$, $C_4H_{10}$, $C_4D_{10}$, $C_4H_6$, $C_4D_6$, $C_2H_2$, $C_2D_2$, $C_2H_7N$, $C_2D_7N$, $C_2H_6$, $C_2D_6$, $C_2H_4$, $C_2D_4$, $C_3H_8$, $C_3D_8$, $C_3H_6$, $C_3D_6$, $CF_4$ and combinations thereof.

35. The method of claim 29, wherein the third precursor is selected from the group consisting of $O_2$, $O_3$, $H_2O_2$, $H_2O$ $NO$, and $N_2O$.

36. The method of claim 26, wherein dilution or carrier gases comprising argon or nitrogen are also used in the CVD process.

37. The method of claim 26, wherein the waveguide forms part of least one thermooptic device.

38. The method of claim 37, wherein the thermooptic device comprises a local resistive heater.

39. The method of claim 38, wherein a temperature of the thermooptic device is monitored with a local temperature sensor selected from the group consisting of a resistive temperature device, a thermistor, and a thermocouple.

40. The method of claim 26, wherein the CVD process is selected from the group consisting of plasma enhanced CVD, high density plasma CVD, low pressure CVD, and atmospheric pressure CVD.

41. The method of claim 26, wherein the core further comprises hydrogen, deuterium, nitrogen, germanium, phosphorus, boron, or flourine.

42. The method of claim 26, further comprising the step of forming multiple layers of optical waveguides.

43. The method of claim 26, wherein the refractive index contrast is between 0.1 and 0.72.

44. The method of claim 26, wherein the refractive index contrast is between about 0.18 and 0.72.

45. The method of claim 26 wherein the dn/dT of the core is between about $1.0\times10^{-5}$ and about $2.0\times10^{-5}$.

46. The method of claim 26, wherein the waveguide has a form selected from the group consisting of ridge, trench, and filled-trench optical waveguides.

47. The method of claim 26, further comprising the step of illuminating the optical waveguide with an optical signal, wherein the optical loss is less than 0.5 dB/cm at an optical wavelength or band of wavelengths of the optical signal.

48. The method of claim 47, wherein the optical band signal contains a wavelength within the range 1.45 to 1.65 microns.

49. The method of claim 26, wherein the first cladding is $SiO_2$ thermal oxide having a thickness of between 0.5 microns and 50 microns.

50. The method of claim 26, wherein the second cladding is deposited using high density plasma chemical vapor deposition.

51. A device comprising:
a first cladding formed over a substrate;
a core formed over the first cladding, the core comprising silicon, oxygen, carbon, and deuterium, the core having a refractive index between 1.5 and 2.5, the core having a dn/dT between $1\times10^{-5}$ and $3\times10^{-5}$ per degree Celsius, the core being formed by a chemical vapor deposition (CVD) process using an inorganic precursor comprising silicon; and
a second cladding formed over the core and the first cladding such that the core, the first cladding, and the second cladding form an optical waveguide.

52. A method for forming an optical waveguide comprising:
forming a first cladding over a substrate;
forming a core over the first cladding, the core comprising silicon, oxygen, carbon and deuterium, the core having a refractive index between 1.5 and 2.5, the core having a dn/dT between $1\times10^{-5}$ and $3\times10^{-5}$ per degree Celsius, the core being formed by a chemical vapor deposition (CVD) process using an inorganic precursor comprising silicon; and
forming a second cladding over the core such that the first cladding, the core and the second cladding form an optical waveguide.

* * * * *